United States Patent
Parthasarathy et al.

(10) Patent No.: US 12,550,453 B2
(45) Date of Patent: Feb. 10, 2026

(54) LOW CAPACITANCE POLY-BOUNDED SILICON CONTROLLED RECTIFIERS

(71) Applicant: Analog Devices, Inc., Wilmington, MA (US)

(72) Inventors: Srivatsan Parthasarathy, Acton, MA (US); Shudong Huang, Malden, MA (US); Yuanzhong Zhou, Andover, MA (US); Jean-Jacques Hajjar, Lexington, MA (US)

(73) Assignee: Analog Devices, Inc., Wilmington, MA (US)

( * ) Notice: Subject to any disclaimer, the term of this patent is extended or adjusted under 35 U.S.C. 154(b) by 425 days.

(21) Appl. No.: 18/306,544

(22) Filed: Apr. 25, 2023

(65) Prior Publication Data

US 2024/0363618 A1    Oct. 31, 2024

(51) Int. Cl.
H10D 89/60    (2025.01)

(52) U.S. Cl.
CPC .................. *H10D 89/713* (2025.01)

(58) Field of Classification Search
CPC ... H10D 89/713; H10D 18/251; H10D 84/138
See application file for complete search history.

(56) References Cited

U.S. PATENT DOCUMENTS

| | | |
|---|---|---|
| 5,541,801 A | 7/1996 | Lee et al. |
| 5,610,790 A | 3/1997 | Staab et al. |
| 5,675,469 A | 10/1997 | Racino et al. |
| 6,768,616 B2 | 7/2004 | Mergens et al. |
| 7,285,828 B2 | 10/2007 | Salcedo et al. |
| 7,566,914 B2 | 7/2009 | Salcedo et al. |
| 7,601,991 B2 | 10/2009 | Salcedo et al. |
| 8,044,457 B2 | 10/2011 | Salcedo et al. |
| 8,222,698 B2 | 7/2012 | Salcedo et al. |
| 8,320,091 B2 | 11/2012 | Salcedo et al. |

(Continued)

FOREIGN PATENT DOCUMENTS

| | | |
|---|---|---|
| CN | 109166850 A | 1/2019 |
| CN | 112397505 A | 2/2021 |

(Continued)

OTHER PUBLICATIONS

Extended European Search Report for International Application No. 24163589.5 dated Sep. 2, 2024 in 9 pages.

(Continued)

*Primary Examiner* — Wasiul Haider
(74) *Attorney, Agent, or Firm* — Knobbe, Martens, Olson & Bear, LLP

(57) ABSTRACT

Low capacitance poly-bounded silicon controlled rectifiers (SCRs) are disclosed herein. In certain embodiments, an SCR includes an n-type well (NW) and a p-type well (PW) formed adjacent to one another in a substrate. The SCR further includes active regions including p-type active (P+) fin regions over the NW and connected to an anode terminal of the SCR, and n-type active (N+) fin regions over the PW and connected to a cathode terminal of the SCR. The SCR further includes polysilicon gate regions over the PW and NW that serve to separate the active regions while also improving the SCR's turn-on speed in response to fast overstress transients.

20 Claims, 10 Drawing Sheets

(56) References Cited

U.S. PATENT DOCUMENTS

| | | |
|---|---|---|
| 8,368,116 B2 | 2/2013 | Salcedo et al. |
| 8,373,956 B2 | 2/2013 | Abou-Khalil et al. |
| 8,416,543 B2 | 4/2013 | Salcedo |
| 8,422,187 B2 | 4/2013 | Parthasarathy et al. |
| 8,432,651 B2 | 4/2013 | Salcedo et al. |
| 8,466,489 B2 | 6/2013 | Salcedo et al. |
| 8,553,380 B2 | 10/2013 | Salcedo |
| 8,564,065 B2 | 10/2013 | Donovan et al. |
| 8,570,698 B2 | 10/2013 | Lee et al. |
| 8,592,860 B2 | 11/2013 | Salcedo et al. |
| 8,598,641 B2 | 12/2013 | Chen et al. |
| 8,610,251 B1 | 12/2013 | Salcedo |
| 8,637,899 B2 | 1/2014 | Salcedo |
| 8,665,571 B2 | 3/2014 | Salcedo et al. |
| 8,680,620 B2 | 3/2014 | Salcedo et al. |
| 8,779,518 B2 | 7/2014 | Lin et al. |
| 8,796,729 B2 | 8/2014 | Clarke et al. |
| 8,860,080 B2 | 10/2014 | Salcedo |
| 8,946,822 B2 | 2/2015 | Salcedo et al. |
| 8,947,841 B2 | 2/2015 | Salcedo et al. |
| 8,958,187 B2 | 2/2015 | Parthasarathy et al. |
| 9,006,781 B2 | 4/2015 | Salcedo et al. |
| 9,088,256 B2 | 7/2015 | Cosgrave et al. |
| 9,123,540 B2 | 9/2015 | Salcedo et al. |
| 9,147,677 B2 | 9/2015 | Salcedo et al. |
| 9,171,832 B2 | 10/2015 | Salcedo et al. |
| 9,275,991 B2 | 3/2016 | Salcedo et al. |
| 9,293,912 B2 | 3/2016 | Parthasarathy et al. |
| 9,318,479 B2 | 4/2016 | Li et al. |
| 9,478,608 B2 | 10/2016 | Salcedo et al. |
| 9,634,482 B2 | 4/2017 | Parthasarathy et al. |
| 9,653,448 B2 | 5/2017 | Zhang et al. |
| 9,831,233 B2 | 11/2017 | Salcedo et al. |
| 9,876,005 B2 | 1/2018 | Su et al. |
| 10,008,491 B1 | 6/2018 | Li et al. |
| 10,083,952 B2 | 9/2018 | Lee et al. |
| 10,158,029 B2 | 12/2018 | Parthasarathy et al. |
| 10,177,566 B2 | 1/2019 | Zhao et al. |
| 10,199,369 B2 | 2/2019 | Parthasarathy et al. |
| 10,249,609 B2 | 4/2019 | Salcedo et al. |
| 10,340,370 B2 | 7/2019 | Wang et al. |
| 10,504,886 B1 | 12/2019 | Yam et al. |
| 11,004,849 B2 | 5/2021 | Salcedo et al. |
| 11,302,689 B1 | 4/2022 | Yam |
| 11,595,036 B2 | 2/2023 | Salcedo et al. |
| 11,942,473 B2 | 3/2024 | Luo et al. |
| 12,261,593 B2 | 3/2025 | Salcedo et al. |
| 2002/0089017 A1 | 7/2002 | Lai et al. |
| 2004/0164356 A1 | 8/2004 | Josef Mergens et al. |
| 2004/0201033 A1 | 10/2004 | Russ et al. |
| 2005/0200396 A1 | 9/2005 | Hsu et al. |
| 2008/0088994 A1 | 4/2008 | Lai |
| 2012/0275073 A1 | 11/2012 | Tsai et al. |
| 2013/0128399 A1 | 5/2013 | Davis et al. |
| 2014/0097465 A1 | 4/2014 | Shrivastava et al. |
| 2014/0167105 A1 | 6/2014 | Salcedo et al. |
| 2014/0268438 A1 | 9/2014 | Davis et al. |
| 2015/0008476 A1 | 1/2015 | Shrivastava et al. |
| 2015/0029622 A1 | 1/2015 | Su et al. |
| 2015/0124360 A1 | 5/2015 | Jack et al. |
| 2016/0056146 A1 | 2/2016 | Li et al. |
| 2016/0056147 A1 | 2/2016 | Li et al. |
| 2016/0141358 A1 | 5/2016 | Salcedo et al. |
| 2016/0204096 A1 | 7/2016 | Zhao et al. |
| 2016/0261110 A1 | 9/2016 | Ivanov et al. |
| 2016/0285255 A1 | 9/2016 | O'Donnell et al. |
| 2016/0300830 A1 | 10/2016 | Salcedo et al. |
| 2016/0336740 A1 | 11/2016 | Parthasarathy et al. |
| 2016/0336744 A1 | 11/2016 | Parthasarathy et al. |
| 2017/0069616 A1 | 3/2017 | Cai et al. |
| 2017/0125399 A1 | 5/2017 | Huang et al. |
| 2017/0256534 A1 | 9/2017 | Parthasarathy et al. |
| 2017/0317070 A1 | 11/2017 | Salcedo et al. |
| 2018/0026440 A1 | 1/2018 | Zhao et al. |
| 2018/0068996 A1 | 3/2018 | Lee |
| 2018/0158814 A1 | 6/2018 | Salcedo et al. |
| 2018/0158935 A1 | 6/2018 | Wang et al. |
| 2018/0211951 A1 | 7/2018 | Luo et al. |
| 2018/0226788 A1 | 8/2018 | Salcedo et al. |
| 2018/0248025 A1* | 8/2018 | Shrivastava ......... H10D 62/134 |
| 2018/0308846 A1 | 10/2018 | Huang et al. |
| 2019/0013310 A1 | 1/2019 | Paul et al. |
| 2019/0027470 A1 | 1/2019 | Han et al. |
| 2019/0131787 A1 | 5/2019 | He et al. |
| 2020/0111778 A1 | 4/2020 | Lai et al. |
| 2020/0286889 A1 | 9/2020 | Salcedo et al. |
| 2020/0403007 A1 | 12/2020 | Thomson et al. |
| 2021/0344336 A1 | 11/2021 | Salcedo et al. |
| 2023/0163757 A1 | 5/2023 | Salcedo et al. |
| 2024/0363618 A1 | 10/2024 | Parthasarathy et al. |
| 2025/0202471 A1 | 6/2025 | Salcedo et al. |

FOREIGN PATENT DOCUMENTS

| | | |
|---|---|---|
| CN | 113921516 A | 1/2022 |
| JP | 2012104552 | 5/2012 |
| KR | 10-0968647 B1 | 7/2010 |
| WO | WO 2017/052553 A1 | 3/2017 |
| WO | WO2017078676 A1 | 5/2017 |

OTHER PUBLICATIONS

Parthasarathy et al., "Device for Protecting High Frequency and High Data Rate Interface Applications in FinFET Process Technologies", 2022 IEEE Radio Frequency Integrated Circuits Symposium, IEEE Jun. 19, 2022, pp. 203-206.

Karp et al., "FinFET MPSoC 32 GB/s transceivers: Custom ESD protection and verification." 2016 IEEE 59th International Midwest Symposium on Circuits and Systems (MWSCAS). IEEE, 2016, in 4 pages.

* cited by examiner

LOW CAPACITANCE POLY-BOUNDED SILICON CONTROLLED RECTIFIERS

FIELD OF THE DISCLOSURE

Embodiments of the invention relate to electronic systems, and more particularly to, electrical overstress protection for radio frequency signal interfaces.

BACKGROUND

Electronic systems can be exposed to electrical overstress events, or electrical signals of short duration having rapidly changing voltage and high power. Such electrical overstress events can occur during manufacturing, assembly, and/or end-user application environment. Electrical overstress events include, for example, electrical overstress (EOS), electromagnetic interference (EMI), and electrostatic discharge (ESD) arising from the abrupt release of charge from an object or person to an electronic system. The design constraints to safely handle these type of environmental overstress conditions are particularly complex in fin field-effect-transistor (FinFET) systems-on-a-chip (SoC) for high frequency applications.

Electrical overstress events can damage or destroy integrated circuits (ICs) by generating overvoltage conditions and high levels of power dissipation in relatively small areas of the ICs. High power dissipation can increase IC temperature, and can lead to numerous problems, such as gate oxide punch-through, junction damage, metal damage, and surface charge accumulation.

SUMMARY OF THE DISCLOSURE

Low capacitance poly-bounded silicon controlled rectifiers (SCRs) are disclosed herein. In certain embodiments, an SCR includes an n-type well (NW) and a p-type well (PW) formed adjacent to one another in a substrate. The SCR further includes active regions including p-type active (P+) fin regions over the NW and connected to an anode terminal of the SCR, and n-type active (N+) fin regions over the PW and connected to a cathode terminal of the SCR. The SCR further includes polysilicon gate regions over the PW and NW that serve to separate the active regions while also improving the SCR's turn-on speed in response to fast overstress transients. Accordingly, the NW and PW of the SCR are bounded by polysilicon gate regions to achieve an enhancement in turn on speed. The polysilicon gate regions can be formed as gate fins as part of a FinFET process. In contrast, conventional SCRs do not include such polysilicon gate regions, but rather include shallow trench isolation (STI) regions to separate active regions formed in wells.

By including the polysilicon gate regions, performance parameters of the SCR are enhanced to provide an improvement in turn-on speed. For example, the P+ fin regions, the NW, and the PW form the emitter, base, and collector, respectively, of a PNP bipolar transistor of the SCR. Additionally, the polysilicon gate regions separate the active regions of the SCR and reduce a base width of the PNP bipolar transistor relative to a configuration in which STI is used for separating active regions. Providing a narrow base width directly impacts the base-transit time of the PNP bipolar transistor, resulting in faster protection. The SCR can be fabricated in a variety of advanced technologies, including CMOS FinFET process nodes of 16 nm or less.

In one aspect, an SCR protection structure for protecting an interface from an electrical overstress event is provided. The SCR protection structure includes an n-type well (NW) formed in a substrate, a p-type well (PW) formed in the substrate adjacent to the NW, a plurality of active regions including a first p-type active (P+) fin region over the NW and connected to an anode terminal and a first n-type active (N+) fin region over the PW and connected to a cathode terminal, and a plurality of polysilicon gate regions formed over the PW and NW. The plurality of polysilicon gate regions separate the plurality of active regions.

In another aspect, a semiconductor die is disclosed. The semiconductor die includes a plurality of pads including a signal pad and a ground pad, a circuit electrically connected to the signal pad, and an SCR including an anode terminal electrical connected to the signal pad and a cathode terminal electrically connected to the ground pad. The SCR includes an n-type well (NW) formed in a substrate, a p-type well (PW) formed in the substrate adjacent to the NW, a plurality of active regions including a first p-type active (P+) fin region over the NW and connected to the anode terminal and a first n-type active (N+) fin region over the PW and connected to the cathode terminal, and a plurality of polysilicon gate regions formed over the PW and NW. The plurality of polysilicon gate regions separate the plurality of active regions.

In another aspect, a method of forming an SCR protection structure is disclosed. The method includes forming an n-type well (NW) in a substrate, forming a p-type well (PW) formed in the substrate adjacent to the NW, and forming a plurality of active regions over the PW and the NW. The plurality of active regions include a first p-type active (P+) fin region over the NW and serving as an anode of the SCR, and a first n-type active (N+) fin region over the PW and serving as a cathode of the SCR. The method further includes separating the plurality of active regions by forming a plurality of polysilicon gate regions over the PW and NW.

DETAILED DESCRIPTION

Figure 1A:
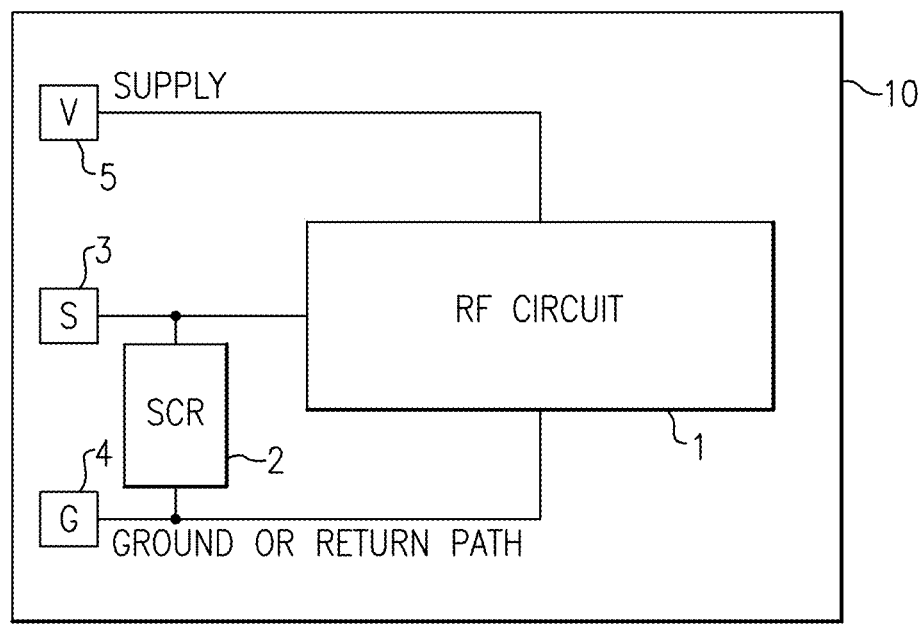
FIG. 1A is a schematic diagram of one embodiment of an integrated circuit (IC) including a silicon controlled rectifier (SCR) for electrical overstress protection.

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Certain electronic systems include overstress protection circuits to protect circuits and/or components from electrical overstress events. To help guarantee that an electronic system is reliable, manufacturers test such electronic systems under defined stress conditions, which can be described by standards set by various organizations, such as the Joint Electronic Device Engineering Council (JEDEC), the International Electrotechnical Commission (IEC), and the Automotive Engineering Council (AEC). The standards can cover a wide multitude of electrical overstress events, including electrical overstress (EOS) and/or electrostatic discharge (ESD).

A number of design challenges are present for protecting radio frequency (RF) circuits from electrical overstress events, particularly when such RF circuits are fabricated using FinFET processes. For example, the performance of RF circuits is degraded by capacitive loading and/or non-linearity arising from the presence of electrical overstress protection structures along RF signal paths. Furthermore, FinFET gate structures are easily damaged in response to electrical overstress conditions, thus rendering RF circuits fabricated with a FinFET process particularly susceptible to damage.

Conventional diode-based RF input-output (IO) protection poses significant limitations in achieving RF performance for advancing 5G communication requirements while preserving interface robustness.

For example, diode-based protection structures can suffer from slow reaction time and/or large voltage overshoot when subjected to fast ESD transients. Such large voltage overshoots can damage thin oxides being protected in advanced nm process nodes, such as complementary metal oxide semiconductor (CMOS) FinFET technologies of 16 nm or less.

Additionally, diode-based protection structures can have high trigger voltage that allows for large voltage build-up before activation. Moreover, diode-based protection structures can suffer from high capacitance and/or non-linearity that can degrade RF performance during normal operation when electrical overstress events are not present.

Low capacitance poly-bounded silicon controlled rectifiers (SCRs) are disclosed herein. In certain embodiments, an SCR includes an n-type well (NW) and a p-type well (PW) formed adjacent to one another in a substrate. The SCR further includes active regions including p-type active (P+) fin regions over the NW and connected to an anode terminal of the SCR, and n-type active (N+) fin regions over the PW and connected to a cathode terminal of the SCR. The SCR further includes polysilicon gate regions over the PW and NW that serve to separate the active regions while also improving the SCR's turn-on speed in response to fast overstress transients.

Accordingly, the NW and PW of the SCR are bounded by polysilicon gate regions to achieve an enhancement in turn on speed. The polysilicon gate regions can be formed as gate fins as part of a FinFET process. In contrast, conventional SCRs do not include such polysilicon gate regions, but rather include shallow trench isolation (STI) regions to separate active regions formed in wells.

By including the polysilicon gate regions, performance parameters of the SCR are enhanced to provide an improvement in turn-on speed. For example, the P+ fin regions, the NW, and the PW form the emitter, base, and collector, respectively, of a PNP bipolar transistor of the SCR. Additionally, the polysilicon gate regions separate the active regions of the SCR and reduce a base width of the PNP bipolar transistor relative to a configuration in which STI is used for separating active regions. Providing a narrow base width directly impacts the base-transit time of the PNP bipolar transistor, resulting in faster protection.

The SCR can be fabricated in a variety of advanced technologies, including CMOS FinFET process nodes of 16 nm or less.

The anode terminal and the cathode terminal of the SCR can be connected to provide protection to an RF circuit, which can be fabricated with the SCR on a common integrated circuit (IC). In certain implementations, the anode terminal connects to an RF signal pad of the IC while the cathode terminal connects to a ground signal pad of the IC. Thus, the SCR can be ground-referenced and used to protect an RF circuit formed on a common IC. In one example, the SCR protects an RF signal pad or port operating with asymmetrical signal swings in the range of +2.0V/−1.0V and having an operating frequency of up to about 20 GHz. However, the SCRs herein can be deployed in other configurations and operating scenarios.

In certain implementations, a voltage of the NW (corresponding to base voltage of the PNP) is left floating, which serves to reduce a trigger voltage of the SCR. In contrast, conventional diode and SCR protection structures suffer from a large trigger voltage that leads to a large voltage build-up and corresponding damage to circuitry being protected.

The NW and the PW of the SCR can be isolated from the substrate (for example, a p-type substrate) by deep n-type well (DNW). In certain implementations, rather than directly connected the DNW to a power supply voltage (for example, a highest available supply voltage with the aim of preventing parasitic diodes between the PW and DNW and/or between the substrate and DNW from becoming forward biased), a DNW bias circuit is included between the power supply voltage and DNW.

By including the DNW bias circuit, linearity performance is improved by blocking a potential path between the SCR's anode and the power supply voltage for RF signals. Furthermore, including the DNW bias circuit allows biasing of the DNW to a desired electrical potential to achieve low capacitance.

Accordingly, inclusion of the DNW bias circuit can achieve both improved linearity and reduced capacitance relatively to an implementation in which the DNW is directly connected to the highest available supply voltage.

The SCR includes a PNP bipolar transistor and an NPN bipolar transistor that are cross-coupled. For example, the P+ fin regions, the NW, and the PW form the emitter, base, and collector, respectively, of the PNP bipolar transistor, while the N+ fin regions, the PW, and the NW form the emitter, base, and collector, respectively, of the NPN bipolar transistor. Additionally, the collector of the NPN bipolar transistor is connected to the base of the PNP bipolar transistor, while the collector of the PNP bipolar transistor is connected to the base of the NPN bipolar transistor.

In certain implementations, a trigger circuit is included between the anode of the SCR and the base of the NPN bipolar transistor. Inclusion of the trigger circuit serves to further reduce the trigger voltage of the SCR by providing a displacement current to the base of the NPN bipolar transistor in response to an electrical overstress event. A tuning circuit (for example, a tuning resistor or other tuning element) can be included at the base of the NPN bipolar transistor to provide fine-tuned control over turn-on characteristics of the SCR. The trigger circuit can also serve to reduce DC leakage current of the SCR by biasing the base of the NPN bipolar transistor.

The SCRs disclosed herein serve to robustly protect RF circuits and/or other core devices with high speed, high voltage tolerance, high linearity, and/or low capacitance. The SCRs provide protection against electrical overstress events, which can include ESD events. Thus, the SCR provides robust protection from overstress conditions with little to no degradation to RF performance parameters such as second-order harmonic distortion (HD2), third-order harmonic distortion (HD3), third-order intermodulation distortion (IMD3), and/or third-order intercept point (IP3). Furthermore, the SCR behaves linearly with respect to capacitance and current characteristics such that presence of the protection device provides little to no interference with operation of the RF signal interface.

The teachings herein are applicable to SCRs that protect RF signal pads handling RF signals of a wide range of frequencies, including not only RF signals between 100 MHz and 7 GHZ, but also to higher frequencies, such as those in the X band (about 7 GHZ to 12 GHZ), the $K_u$ band (about 12 GHZ to 18 GHZ), the K band (about 18 GHZ to 27 GHZ), the $K_a$ band (about 27 GHz to 40 GHZ), the V band (about 40 GHz to 75 GHZ), and/or the W band (about 75 GHz to 110 GHz). Accordingly, the teachings herein are applicable to protecting a wide variety of RF circuits, including microwave circuits.

Furthermore, the RF circuits protected by the SCRs herein can be associated with a variety of communication standards, including, but not limited to, Global System for Mobile Communications (GSM), Enhanced Data Rates for GSM Evolution (EDGE), Code Division Multiple Access (CDMA), wideband CDMA (W-CDMA), 3G, Long Term Evolution (LTE), 4G, and/or 5G, as well as other proprietary and non-proprietary communications standards.

FIG. 1A is a schematic diagram of one embodiment of an IC 10. The IC 10 includes an RF circuit 1, an SCR 2, an RF signal(S) pad 3, a ground (G) pad 4, and a power supply voltage (V) pad 5. An IC is also referred to herein as a semiconductor die or chip. Although certain circuits and pins of the IC 10 are shown in FIG. 1A, the IC 10 can be adapted to include additional pins and/or circuitry. Such details are omitted from FIG. 1A for clarity of the figure.

In the illustrated embodiment, the SCR 2 is integrated with the RF circuit 1 on a common chip. The RF circuit 1 can include one or more of wide range of high frequency circuits for handling RF signals including, but not limited to, RF amplifiers, RF mixers, RF attenuators, RF filters, RF data converters, and/or other circuitry. Although shown as protecting an RF circuit, the SCRs herein can also be used to protect other types of circuits and/or components.

The RF circuit 1 is connected to the RF signal pad 3, which can correspond to an input signal pad, an output signal pad, or a bidirectional signal pad. The RF circuit 1 also receives a ground voltage from the ground pad 4 and a power supply voltage from the power supply voltage pad 5.

In the illustrated embodiment, the SCR 2 includes an anode connected to the RF signal pad 3 and a cathode connected to the ground pad 4. The SCR 2 is normally in a high impedance or off state, but transitions to a low impedance or on state in response to an electrical overstress event received between the RF signal path 3 and the ground pad 4. Thus, the SCR 2 serves as a ground referenced protection structure for providing protecting against ESD and/or other electrical overstress events received on the RF signal pad 3.

A traditional ground referenced diode-based ESD protection circuit causes high distortion due to stacking of multiple diodes to allow for large RF power handling. However, stacking multiple diodes leads to elevated distortion due to non-linearity and/or higher on-state resistance that degrades ESD performance.

In comparison, the SCR 2 of FIG. 1A can be implemented with one or more features of the present disclosure to achieve low trigger voltage, low capacitance, high power handling capability, and/or high linearity.

Although FIG. 1A illustrates one example application for SCR protection structures, the teachings herein are applicable to a wide variety of high-speed interfaces.

Figure 1B:
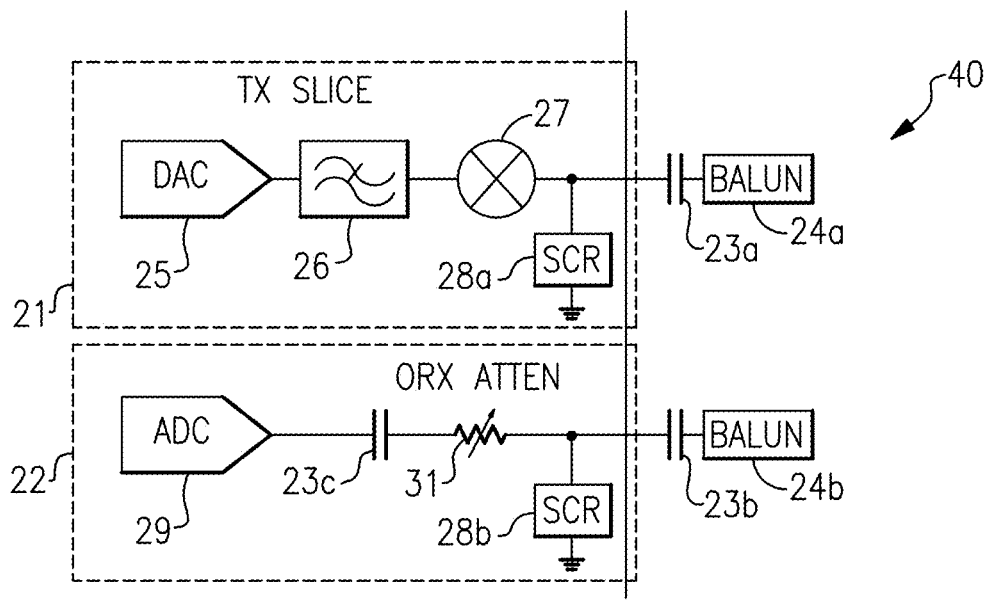
FIG. 1B is a schematic diagram of one embodiment of a radio transmitter using SCRs for electrical overstress protection.

FIG. 1B is a schematic diagram of one example of a radio transmitter 40 using SCRs for electrical overstress protection. The radio transmitter 40 includes a transmitter slice 21, an observation receiver slice 22, a first DC blocking capacitor 23a, a second DC blocking capacitor 23b, a first balun 24a, and a second balun 24b.

As shown in FIG. 1B, the transmitter slice 21 includes a DAC 25, a low pass filter 26, a mixer 27, and a first SCR 28a that is coupled between an output of the mixer 27 and ground. Additionally, the observation receiver 22 includes an ADC 29, a third DC blocking capacitor 23c, a controllable attenuator 31 (for instance, a voltage variable attenuator or digital step attenuator), and a second SCR 28b that is connected between an input of the controllable attenuator 31 and ground.

The radio transmitter 40 illustrates another example application for the SCRs disclosed herein. Although FIG. 1B illustrates another example application for SCR protection structures, the teachings herein are applicable to a wide variety of high-speed interfaces.

Figure 2:
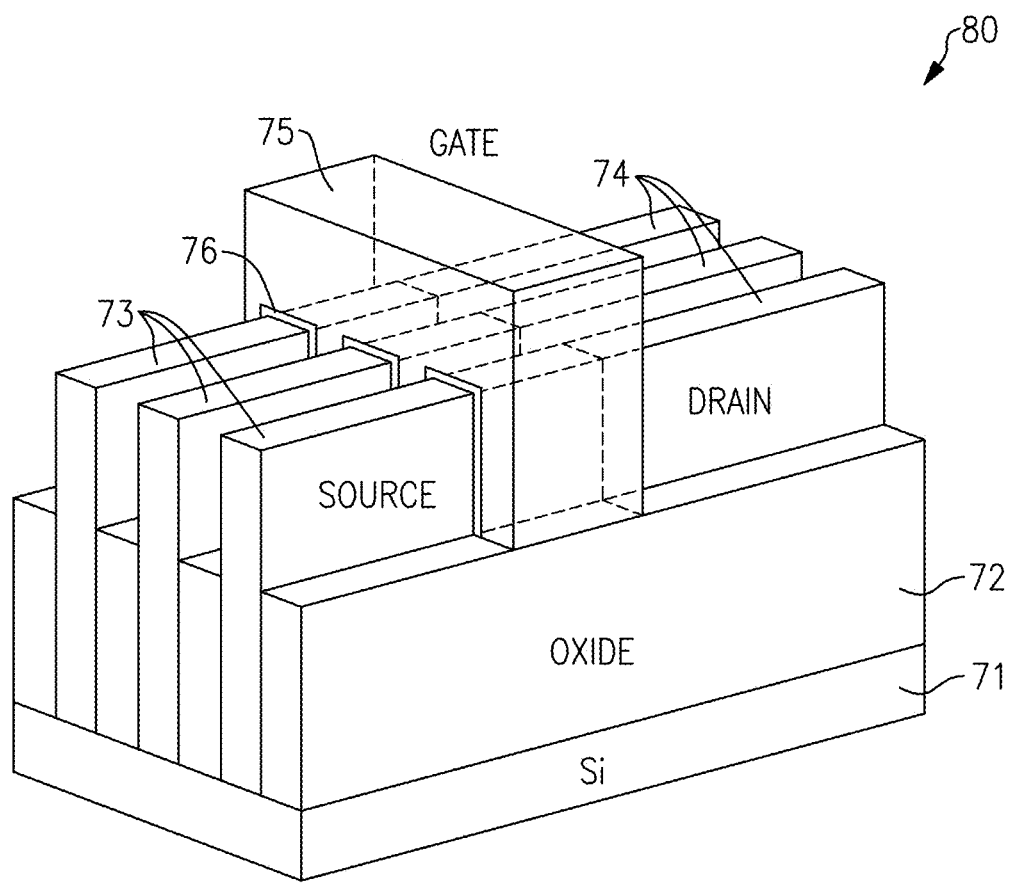
FIG. 2 is a perspective view of a fin field-effect transistor (FinFET) according to one embodiment.

FIG. 2 is a perspective view of a fin field-effect transistor (FinFET) 80 according to one embodiment. The FinFET 80 is fabricated on a silicon (Si) substrate 71, which can be doped (for example, using a p-type dopant). The FinFET 80 includes oxide regions 72 in which active fin regions have been formed. The active fin regions include source fin regions 73 and drain fin regions 74, which can be doped n-type and/or p-type as desired for a particular application. Additionally, a gate oxide region 76 and a polysilicon gate fin 75 have been formed over a portion of the active fin regions to form the FinFET 80.

The FinFET 80 can provide a number of advantages relative to other transistor technologies. For example, the FinFET 80 facilitates higher level of integration and technology scaling. Moreover, the FinFET 80 can provide higher electrical control over a channel, more effective leakage suppression, enhanced driving current, and/or higher intrinsic gain for superior analog performance.

Thus, the FinFET 80 provides a number of advantages suitable for deployment in ICs for high-speed data conversion, wide bandwidth wireless communications, and/or other high-performance applications. For instance, a semiconductor chip implemented with FinFETs can be used to enable the high-speed applications discussed above with reference to FIGS. 1A-1B.

Accordingly, to aid in meeting bandwidth constraints for 5G or other high performance applications, it is desirable use FinFET technology to fabricate semiconductor dies (also referred to herein as integrated circuits or ICs) for high-performance transceivers and/or high-speed interfaces.

Although FinFET technology can provide a number of advantages, such FinFETs can operate with higher parasitic resistance, higher parasitic capacitance, and/or poorer thermal characteristics (for instance, higher thermal impedance and/or more self-heating) relative to transistors fabricated using a conventional complementary metal oxide semiconductor (CMOS) process. Such characteristics can render FinFETs susceptible to damage from electrical overstress.

The teachings herein can be used to provide electrical overstress protection for ICs fabricated using FinFET technologies, thereby helping to meet tight design windows for robustness. For example, in certain embodiments herein, high voltage tolerant FinFET SCRs are provided for handling high stress current and high RF power handling capability, while providing low capacitance to allow wide bandwidth operation.

Figure 3A:
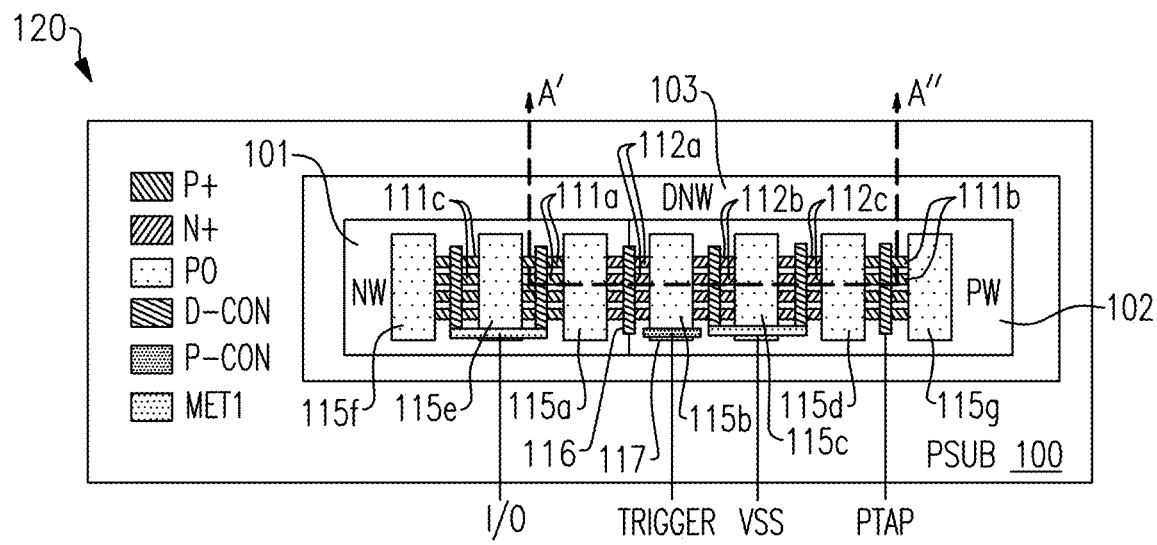
FIG. 3A is a plan view of a FinFET SCR according to one embodiment.
Figure 3B:
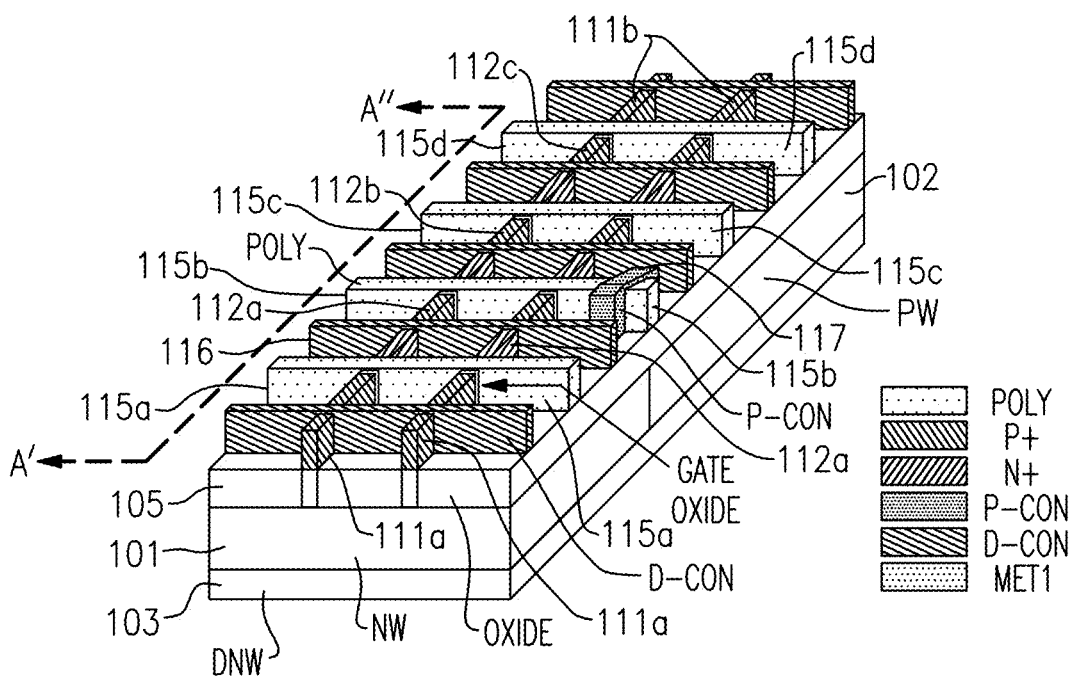
FIG. 3B is a perspective view of a portion of the FinFET SCR of FIG. 3A.

FIG. 3A is a plan view of a FinFET SCR 120 according to one embodiment. FIG. 3B is a perspective view of a portion of the FinFET SCR 120 of FIG. 3A taken along the lines A' to A".

With reference to FIGS. 3A and 3B, the FinFET SCR 120 illustrates one embodiment of a chip layout used to implement an SCR in accordance with the teachings herein. However, the SCRs disclosed herein can be implemented in other ways. One or more instantiations of the FinFET SCR 120 can be included on a semiconductor die to protect circuitry of the die's interface from damage arising from electrical overstress events, such as ESD events.

The SCR protection structures herein can include various wells (for instance, n-type well (NW) and/or p-type well (PW) regions), various active regions (for instance, n-type active (N+) and/or p-type active (P+) regions), gates, and/or other structures. As persons of ordinary skill in the art will appreciate, P+ regions have a higher doping concentration than the PWs. Additionally, N+ regions have a higher doping concentration than NWs. Persons having ordinary skill in the art will appreciate various concentrations of dopants in the regions.

It should be appreciated that because regions within a semiconductor device are defined by doping different parts of a semiconductor material with differing impurities or differing concentrations of impurities, discrete physical boundaries between different regions may not actually exist in the completed device but instead regions may transition from one to another. Some boundaries as shown in the figures of this type and are illustrated as abrupt structures merely for the assistance of the reader. As persons having ordinary skill in the art will appreciate, p-type regions can include a p-type semiconductor material, such as boron, as a dopant. Furthermore, n-type regions can include an n-type semiconductor material, such as phosphorous, as a dopant.

With continuing reference to FIGS. 3A and 3B, the FinFET SCR 120 is fabricated in a p-type substrate (PSUB) 100. Additionally, a deep n-type well (DNW) 103 is formed in the PSUB 100, and an NW 101 and a PW 102 are formed adjacent to one another in the DNW 103. The DNW 103 serves to electrically isolate the NW 101 and the PW 102 from the PSUB 100.

Various active fin regions have been formed over the NW 101 and/or PW 102. In particular, a first group of P+ fin regions 111*a* are formed over the NW 101, a second group of P+ fin regions 111*b* are formed over the PW 102, and a third group of P+ fin regions 111*c* are formed over the NW 101. Additionally, a first group of N+ fin regions 112*a* are formed over the NW 101 and the PW 102, and extend over a boundary between the NW 101 and the PW 102. Furthermore, a second group of N+ fin regions 112*b* are formed over the PW 102 and a third group of N+ fin regions 112*c* are formed over the PW 102.

In the illustrated embodiment, each group of fin regions includes four fins. However, each group of fin regions can include more or fewer fins. For example, the number of fins can be selected to control a current handling capability of the device.

With continuing reference to FIGS. 3A and 3B, various metallization including contact metallization (poly contact CON-P and diffusion contact CON-D) and metal one routes (M1) are depicted. The metallization is used in part to form connections that serve as terminals of the device. For example, the metallization includes an I/O terminal (corresponding to an anode of the FinFET SCR 120) that is connected to the first group of P+ fin regions 111*a* and the third group of P+ fin regions 111*c*. Additionally, the metallization includes a VSS terminal (corresponding to a cathode of the FinFET SCR 120) that is connected to the second group of N+ fin regions 112*b* and the third group of N+ fin regions 112*c*. Furthermore, the metallization includes a PTAP terminal for connecting to the second P+ fin regions 111*b*. In certain implementations, the PTAP terminal is connected to a trigger circuit and/or a tuning circuit to aid in providing control of the FinFET SCR's triggering characteristics. Although not shown in FIGS. 3A and 3B, metallization can also be included to form a terminal for connecting to the DNW 103.

The FinFET SCR 120 includes an NPN bipolar transistor having an emitter, a base, and a collector corresponding to the N+ fin regions 112*b*/112*c*, the PW 102, and the NW 101, respectively. Additionally, the FinFET SCR 120 includes a PNP bipolar transistor having an emitter, a base, and a collector corresponding to the P+ fin regions 111*a*/111*c*, the NW 101, and the PW 102, respectively.

With continuing reference to FIGS. 3A and 3B, the FinFET SCR 120 further includes various polysilicon gate regions over the NW 101 and the PW 102. The polysilicon gate regions include a first polysilicon gate region 115*a* between the first group of P+ fin regions 111*a* and the first group of N+ fin regions 112*a*, a second polysilicon gate region 115*b* between the first group of N+ fin regions 112*a* and the second group of N+ fin regions 112*b*, a third polysilicon gate region 115*c* between the second group of N+ fin regions 112*b* and the third group of N+ fin regions 112*c*, a fourth polysilicon gate region 115*d* between the third group of N+ fin regions 112*c* and the second group of P+ fin regions 111*b*, and a fifth polysilicon gate region 115*e* between the first group of P+ fin regions 111*a* and the third group of P+ fin regions 111*c*. The polysilicon gate regions further include a sixth polysilicon gate region 115*f* adjacent to the third group of P+ fin regions 111*c*, and a seventh polysilicon gate region 115*g* adjacent to the second group of P+ fin regions 111*b*.

As shown in FIG. 3A, absent manufacturing variation, the polysilicon gate regions are perpendicular to the active fin regions. Additionally, the polysilicon gate regions separate the active fin regions. Thus rather than using STI regions, the polysilicon gate regions serve to separate the active regions of the SCR.

Inclusion of the polysilicon gate regions 115a-115g improve the SCR's turn-on speed in response to fast overstress transients. Thus, the NW 101 and the PW 102 of the FinFET SCR 120 are bounded by the polysilicon gate regions 115a-115g to achieve an enhancement in turn on speed. For example, the polysilicon gate regions 115a-115g separate the active fin regions of the SCR and reduce a base width of the SCR's PNP bipolar transistor relative to a configuration in which STI is used for separating active regions. Providing a narrow base width directly impacts the base-transit time of the PNP bipolar transistor, resulting in faster protection. The polysilicon gate regions 115a-115g also serve to introduce surface breakdown to lower intrinsic avalanching voltage further downward, thereby lowering trigger voltage.

The FinFET SCR 120 can be fabricated in a variety of advanced technologies, including CMOS FinFET process nodes of 16 nm or less.

In certain implementations, a voltage of the NW 101 (corresponding to base voltage of the PNP) is left floating, which serves to reduce a trigger voltage of the FinFET SCR 120. In contrast, conventional diode and SCR protection structures suffer from a large trigger voltage that leads to a large voltage build-up and corresponding damage to circuitry being protected.

In the illustrated embodiment, the FinFET SCR 120 includes a metal region 116 over a portion of N+ fin regions 112a as well as over a boundary between the NW 101 and the PW 102. Furthermore, the FinFET SCR 120 includes a metal region 117 formed over a portion of the second polysilicon gate region 115b. Inclusion of the metal region 116 and/or the metal region 117 aids in providing fine-tune control over the trigger voltage of the FinFET SCR 120.

Figure 4A:
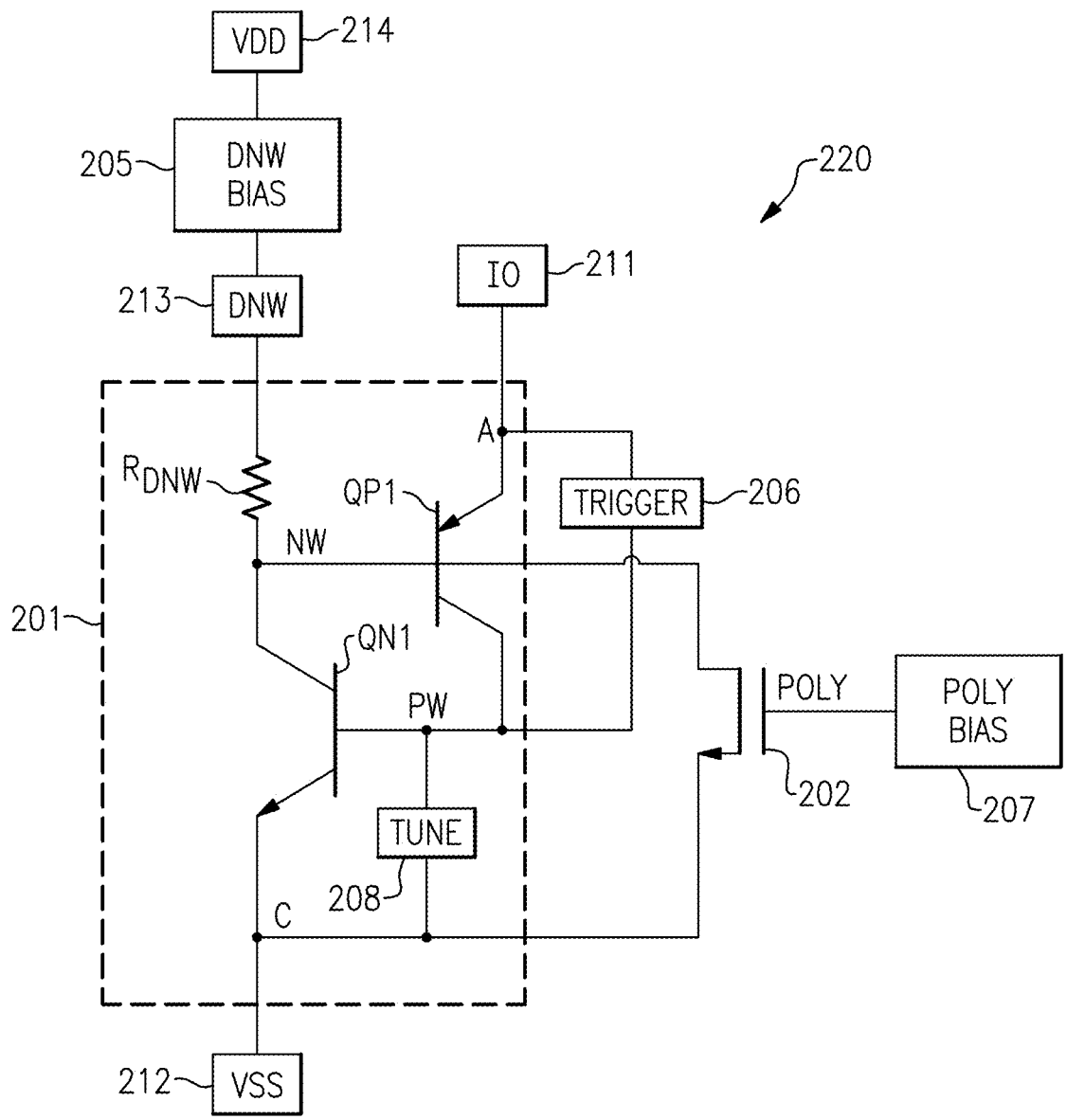
FIG. 4A is a schematic diagram of an SCR according to one embodiment.

FIG. 4A is a schematic diagram of an SCR 220 according to one embodiment. The SCR 220 includes a thyristor structure 201, an n-type field-effect transistor (NFET) 202, a DNW bias circuit 205, a trigger circuit 206, and a gate (poly) bias circuit 207. The SCR 220 also includes various terminals including an input and/or output (I/O or IO) terminal 211, a ground terminal 212, and a DNW terminal 213. Connection of the DNW terminal 213 (also referred to herein as DNW 213) of the SCR 220 to a power supply voltage terminal 214 through the DNW bias circuit 205 is also depicted.

The SCR 220 of FIG. 4A depicts one example of an SCR protection structure implemented in accordance with the teachings herein. In certain implementations, the SCR 220 is fabricated in a FinFET processing technology. For example, the SCR 220 of FIG. 4A can be formed using a layout such as that shown in FIGS. 3A and 3B.

As shown in FIG. 4A, the thyristor structure 201 includes an NPN bipolar QN1 and a PNP bipolar transistor QP1. The base of the NPN bipolar QN1 and a collector of the PNP bipolar transistor QP1 are formed from a PW, while a base of the PNP bipolar QP1 and a collector of the NPN bipolar transistor QN1 are formed from an NW. The thyristor structure 201 also includes a resistor $R_{DNW}$ representing a resistance of a DNW region used to isolate the NW and the PW from a substrate. The resistor $R_{DNW}$ is connected between the DNW terminal 213 and of the base of the PNP bipolar transistor QP1. The thyristor structure 201 also includes the tuning circuit 208 connected between the base of the NPN bipolar transistor QN1 and the emitter of the NPN bipolar transistor QN1. The emitter of the NPN bipolar transistor QN1 serves as a cathode (C) of the SCR 220, while the emitter of the PNP bipolar transistor QP1 serves as an anode (A) of the SCR 220. The cathode (C) of the SCR 220 is connected to the ground terminal 212 and the anode (A) of the SCR 220 is connected to the IO terminal 211, in this embodiment.

With continuing reference to FIG. 4A, the NFET 202 represents polysilicon gate regions formed over the PW and NW that serve to separate the SCR's active regions while also improving the SCR's turn-on speed in response to fast overstress transients. As shown in FIG. 4A, the voltage level of the polysilicon gate regions (corresponding to the gate of the NFET 202) is controlled by the poly bias circuit 207. In certain implementations, the poly bias circuit 207 provides a direct or indirect connection to a fixed voltage, such as the ground terminal 212. However, other implementations are possible, such as configurations in which the polysilicon gate regions are actively biased.

Furthermore, in certain implementations, the poly bias circuit 207 can control the voltage levels of the polysilicon gate regions to different voltage levels. For instance, when the poly bias circuit 207 is used to bias the polysilicon gate regions 115a-115g of FIGS. 3A and 3B, each polysilicon gate region can be biased to a particular voltage level to achieve desired overall performance.

In the illustrated embodiment, the trigger circuit 206 is connected between the IO terminal 211 and the base of the NPN bipolar transistor QN1. The trigger circuit 206 serves to reduce the trigger voltage of the SCR 220 by providing a displacement current to the base of the NPN bipolar transistor QN1 in response to an electrical overstress event received on the IO terminal 211. The trigger circuit 206 also serves to reduce DC leakage current of the SCR 220 by biasing the base of the NPN bipolar transistor QN1. The tuning circuit 208 (for example, a tuning resistor or other tuning element) is also included at the base of the NPN bipolar transistor QN1 to provide fine-tuned control over turn-on characteristics of the SCR 220. The tuning circuit 208 receives the displacement current from the trigger circuit 206, and thus operates in combination with the trigger circuit 206 to aid in activating the thyristor structure 201 in response to an electrical overstress event.

The DNW bias circuit 205 improves linearity performance by blocking a potential path between the IO terminal 211 and the power supply voltage terminal 214 for RF signals. Furthermore, including the DNW bias circuit 205 allows biasing of the DNW 213 to a desired electrical potential to achieve low capacitance.

Figure 4B:
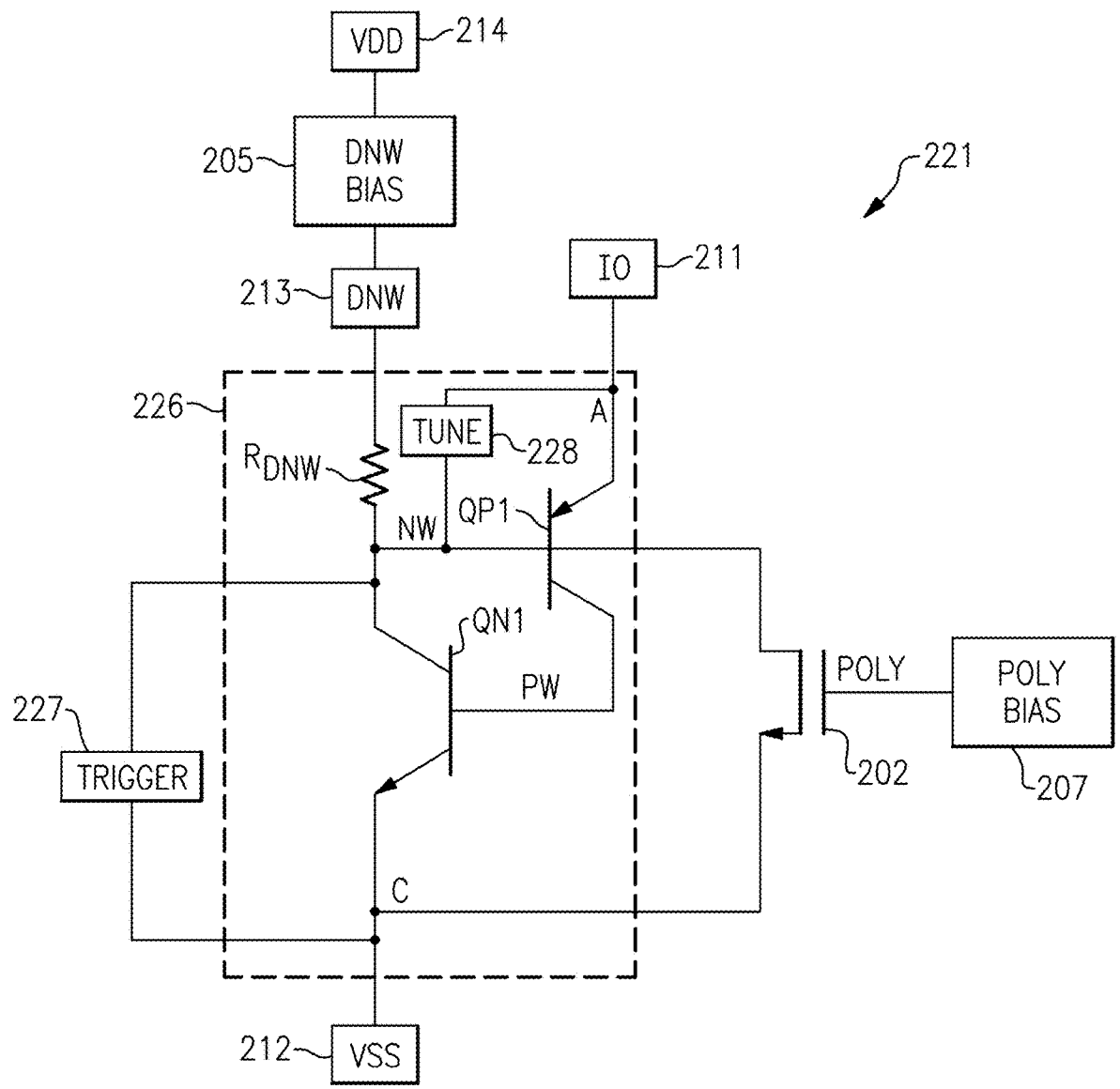
FIG. 4B is a schematic diagram of an SCR according to another embodiment.

FIG. 4B is a schematic diagram of an SCR 221 according to another embodiment. The SCR 221 includes an NFET 202, a DNW bias circuit 205, a poly bias circuit 207, an IO terminal 211, a ground terminal 212, a DNW 213, a power supply voltage terminal 214, a thyristor structure 226, and a trigger circuit 227. The thyristor structure 226 includes an NPN bipolar transistor QN1, a PNP bipolar transistor QP1, a resistor $R_{DNW}$, and a tuning circuit 228.

The SCR 221 of FIG. 4B is similar to the SCR 201 of FIG. 4A, except that the SCR 221 includes a different implementation of triggering. In particular, in the embodiment of FIG. 4B the trigger circuit 227 is connected between the ground terminal 212 and the NW. Thus, a trigger current is provided to the NW (corresponding to the base of the PNP bipolar transistor QP1) in FIG. 4B, rather than to the PW (corresponding to the base of the NPN bipolar transistor QN1) as in FIG. 4A. The teachings herein are directed to implementations in which triggering is provided to the NW of an SCR and/or to a PW of an SCR.

As shown in FIG. 4B, the tuning circuit 228 is electrically connected across the base-to-emitter junction of the PNP bipolar transistor QP1. Thus, the trigger current from the trigger circuit 227 can flow through the tuning circuit 228, thereby building-up the base-to-emitter voltage of the PNP bipolar transistor QP1 and expediting turn-on of the thyristor structure 226.

Figure 4C:
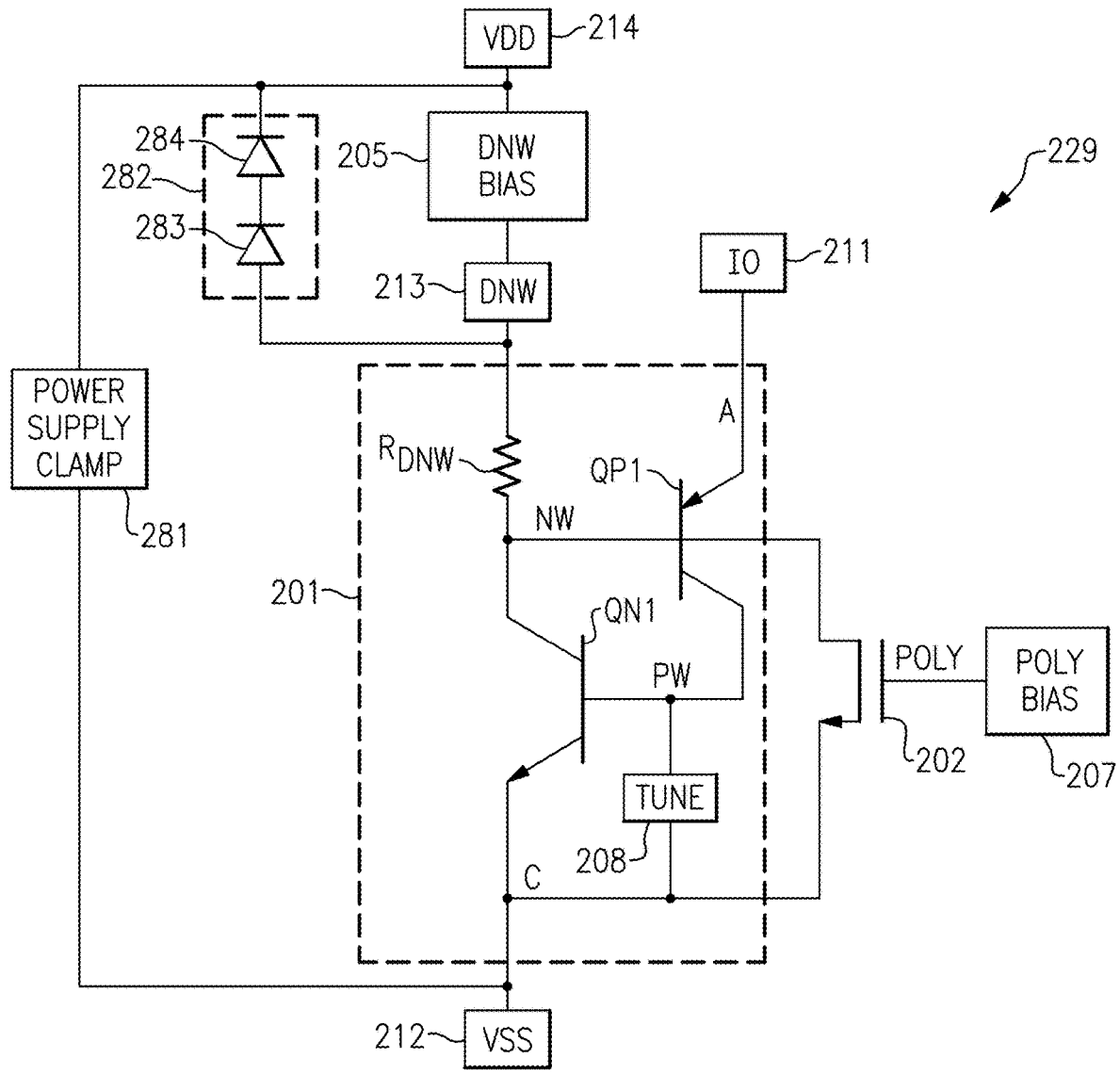
FIG. 4C is a schematic diagram of an SCR according to another embodiment.

FIG. 4C is a schematic diagram of an SCR 229 according to another embodiment. The SCR 229 of FIG. 4C is similar to the SCR 220 of FIG. 4A, except that the SCR 229 includes the trigger circuit 282 connected between the DNW 213 and the power supply voltage terminal 214. Additionally, FIG. 4C depicts a power supply clamp 281 between the power supply voltage terminal 214 and the ground terminal 212.

ICs can include a power supply clamp between a power supply pad and a ground pad (for example, between the power supply pad 5 and the ground pad 4 of FIG. 1A), as part of an overall overvoltage protection scheme for the IC. The power supply clamp 281 of FIG. 4C represents such a power supply clamp. The power supply clamp 281 can aid in protecting against overvoltage conditions such as ESD events between the power supply voltage terminal 214 and the ground terminal 212.

In the illustrated embodiment, the trigger circuit 282 is included between the DNW 213 and the power supply terminal 214. In response to an overvoltage condition received between the IO terminal 211 and the ground terminal 212, a current flows through the forward-biased emitter-to-base junction of the PNP bipolar transistor QP1 and through the trigger circuit 282. This in turn leads to a voltage build-up that triggers activation of the power clamp 281. Furthermore, once activated, the power supply clamp 281 provides an additional discharge path for discharging the overvoltage condition.

Accordingly, the SCR 229 of FIG. 4C operates in combination with the power clamp 281 to collectively provided enhanced overvoltage protection. The current flowing through the trigger circuit 282 expedites activation of the power supply clamp 281 while the power supply clamp 281 also provides an additional discharge path. Thus, the protection scheme of FIG. 4C provides faster protection while also providing additional discharge paths. The presence of additional discharge paths allows for the design to be scaled to smaller size (for instance, the thyristor protection structure 201 to half the size relative to a configuration in which the additional discharge path through the power supply clamp 281 is not present) while still providing about the same protection capability.

In the illustrated embodiment, the trigger circuit 282 includes a first diode 283 and a second diode 284 connected in series between the DNW 213 and the power supply voltage terminal 214. By implementing the trigger circuit 282 in this manner, current conducts through the trigger circuit 282 in response to overvoltage conditions that raise the DNW 213 by about the sum of the forward voltage of the diodes 283/284. However, other implementations are possible. For instance, other numbers of series diodes can be included to tune the activation voltage of the trigger circuit 282.

Figure 5:
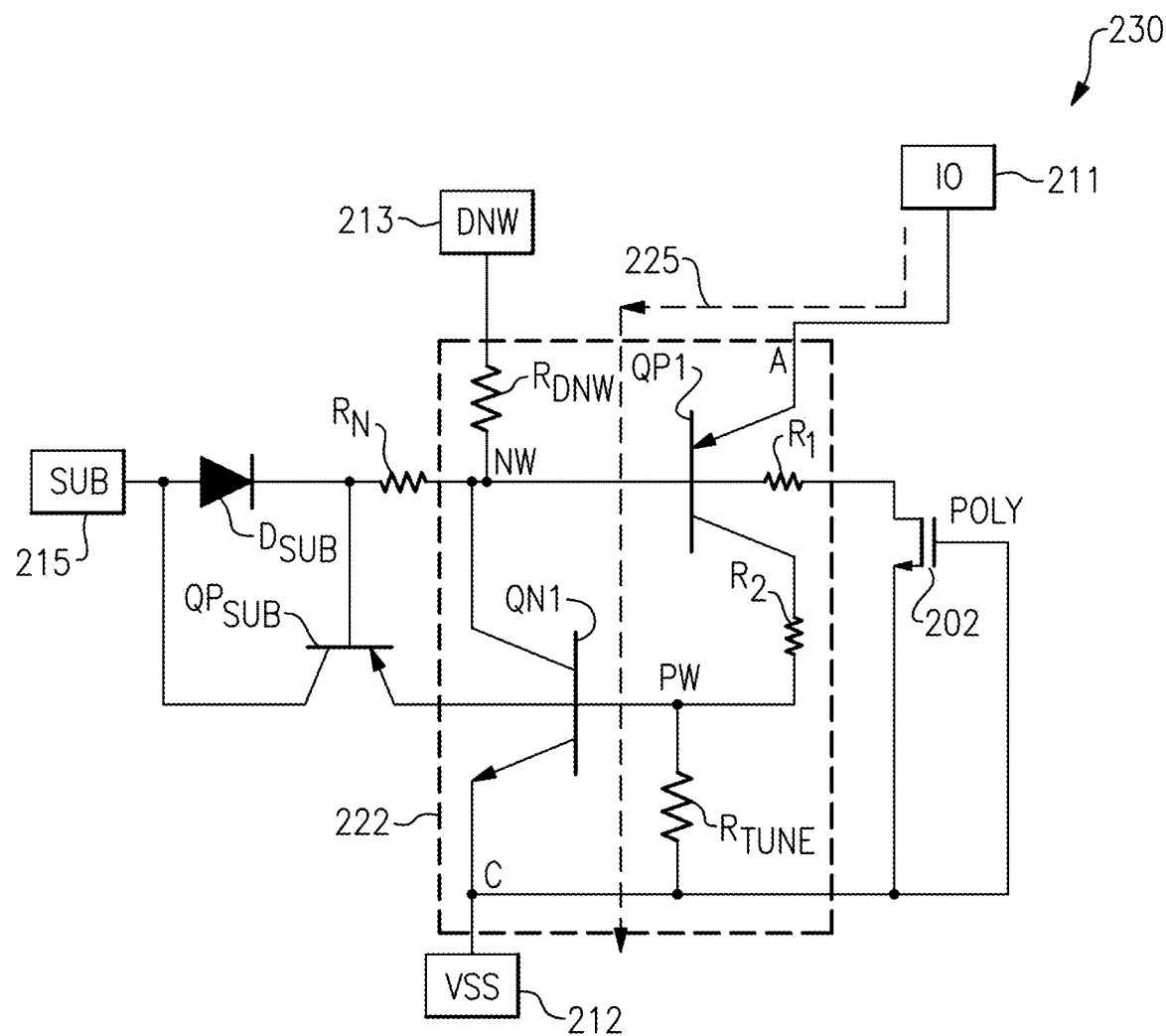
FIG. 5 is a schematic diagram of an SCR according to another embodiment.

FIG. 5 is a schematic diagram of an SCR 230 according to another embodiment. The SCR 230 includes a thyristor structure 222, an NFET 202, an IO terminal 211, a ground terminal 212, a DNW terminal 213, a substrate terminal 215, a resistor Rx, a PNP substrate bipolar transistor $QP_{SUB}$, and a substrate diode $D_{SUB}$.

The SCR 230 of FIG. 5 includes various components that are similar to the SCR 220 of FIG. 4A. In the embodiment of FIG. 5, the gate of the NFET 202 is connected to the ground terminal 212, and thus the polysilicon gate regions that bound the NW and the PW are grounded in this example.

With continuing reference to FIG. 5, various parasitic components associated with a p-type substrate are also depicted. For example, the substrate diode $D_{SUB}$ arises due to an interface between the p-type substrate and the DNW. Additionally, the PNP substrate bipolar transistor $QP_{SUB}$ includes a collector, a base, and an emitter associated with the p-type substrate, the DNW/NW, and the PW, respectively. Furthermore, the resistor Rx represents a resistance of the DNW/NW.

The thyristor structure 222 of FIG. 5 is similar to the thyristor structure 201 of FIG. 4A, except that the thyristor structure 222 includes a specific implementation of a tuning circuit in which a tuning resistor $R_{TUNE}$ is connected across the base-to-emitter junction of the NPN bipolar transistor QN1. Additionally, a first resistor $R_1$ and a second resistor $R_2$ are included to represent well resistances. A current path 225 from the IO terminal 211 to the ground terminal 212 through the thyristor structure 222 is also shown. The current path 225 is activated in response to an electrical overstress event received between the IO terminal 211 and the ground terminal 212.

Figure 6A:
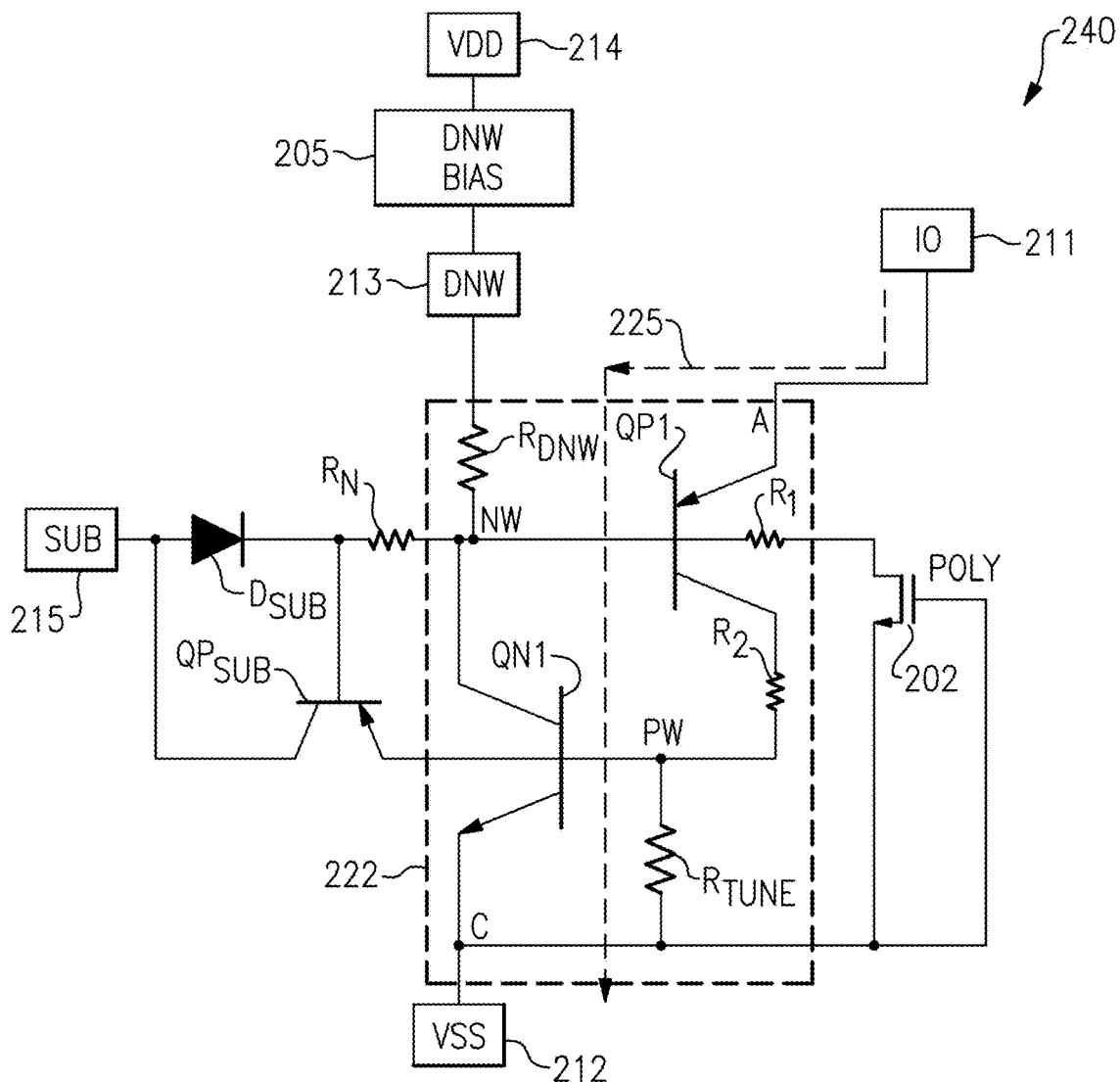
FIG. 6A is a schematic diagram of an SCR according to another embodiment.

FIG. 6A is a schematic diagram of an SCR 240 according to another embodiment. The SCR 240 includes a thyristor structure 222, an NFET 202, an IO terminal 211, a ground terminal 212, a DNW terminal 213, a substrate terminal 215, a resistor Rx, a PNP substrate bipolar transistor $QP_{SUB}$, a substrate diode $D_{SUB}$, and a DNW bias circuit 205.

The SCR 240 of FIG. 6A is similar to the SCR 230 of FIG. 5, except that the SCR 240 of FIG. 6A further includes the DNW bias circuit 205 connecting the DNW terminal 213 to the power supply voltage 214.

The DNW bias circuit 205 improves linearity performance by blocking a potential path between the IO terminal 211 and the power supply voltage 213 for RF signals. Furthermore, including the DNW bias circuit 205 allows biasing of the DNW to a desired electrical potential to achieve low capacitance. Accordingly, inclusion of the DNW bias circuit 205 can achieve both improved linearity and reduced capacitance relatively to an implementation in which the DNW is directly connected to the highest available supply voltage.

Figure 6B:
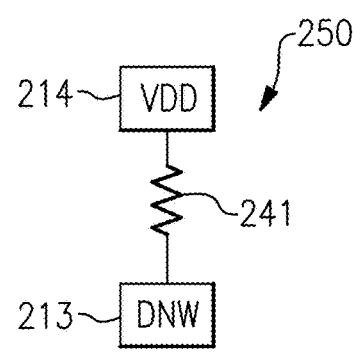
FIG. 6B is a schematic diagram of one embodiment of a deep n-type well (DNW) bias circuit.

FIG. 6B is a schematic diagram of one embodiment of a DNW bias circuit 250. The DNW bias circuit 250 includes a resistor 241 connecting the DNW 213 of an SCR to a power supply voltage terminal 214. The resistor 241 can be high impedance, for example, at least 1 kΩ. In contrast, convention SCRs directly connect a DNW to a highest available power supply voltage.

Figure 7:
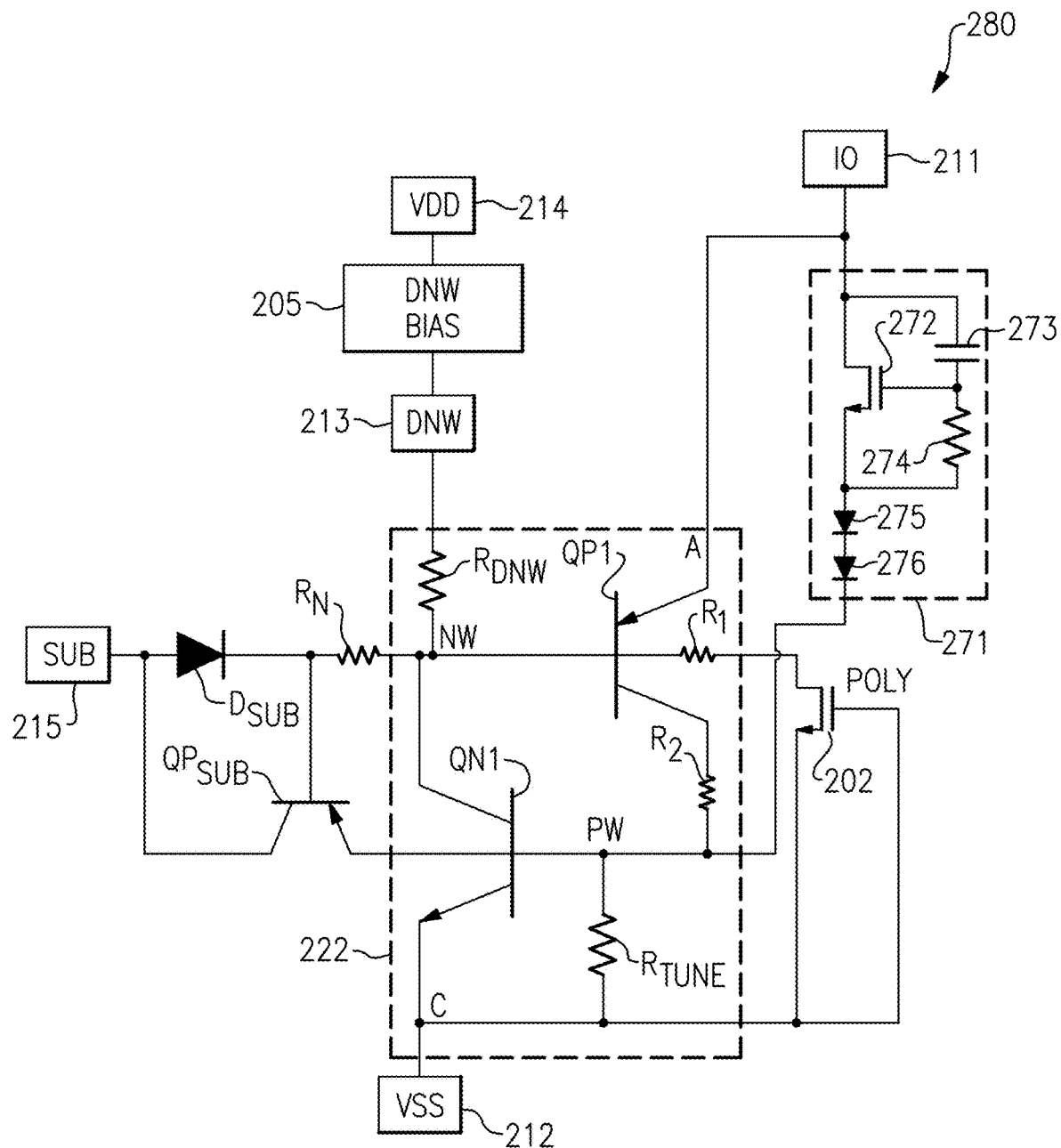
FIG. 7 is a schematic diagram of an SCR according to another embodiment.

FIG. 7 is a schematic diagram of an SCR 280 according to another embodiment. The SCR 280 includes a thyristor structure 222, an NFET 202, an IO terminal 211, a ground terminal 212, a DNW terminal 213, a substrate terminal 215, a resistor RN, a PNP substrate bipolar transistor $QP_{SUB}$, a substrate diode $D_{SUB}$, a DNW bias circuit 205, and a trigger circuit 271.

The SCR 280 of FIG. 7 is similar to the SCR 240 of FIG. 6A, except that the SCR 280 of FIG. 7 further includes the trigger circuit 271 connecting the IO terminal 211 to the base of the NPN bipolar transistor QN1. Although one embodiment of a trigger circuit is shown in FIG. 7, the teachings herein are applicable to trigger circuits implemented in other ways.

In the illustrated embodiment, the trigger circuit 271 includes a trigger NFET 272, a trigger capacitor 273, a trigger resistor 274, a first diode 275, and a second diode 276. The drain of the trigger NFET 272 is connected to the IO terminal 211. Additionally, the trigger capacitor 273 is connected between the drain of the trigger NFET 272 and the gate of the trigger NFET 272. Furthermore, the trigger resistor 274 is connected between the gate of the trigger NFET 272 and the source of the trigger NFET 272. The first diode 275 and the second diode 276 are connected in series (end to end from anode to cathode) between the source of the trigger NFET 272 and the base of the NPN bipolar transistor QN1.

In response to an electrical overstress event received on the IO terminal 211, the trigger circuit 271 generates a displacement current that flows through the tuning resistor $R_{TUNE}$ to increase the base-to-emitter voltage of the NPN bipolar transistor QN1 and turn on the thyristor structure 222.

In the illustrated embodiment, the trigger resistor 274 and the trigger capacitor 273 form a resistor-capacitor (RC) network (or RC-based trigger circuit) that helps reduce the quasi-static trigger voltage of the SCR. Furthermore, the RC-based trigger circuit significantly reduces the DC leakage, and exhibits high insensitivity to dV/dt triggering.

The inclusion of one or more diodes (for example, the diodes 275/276) help to lower the capacitive loading of the trigger circuitry on the IO terminal 211.

Figure 8A:
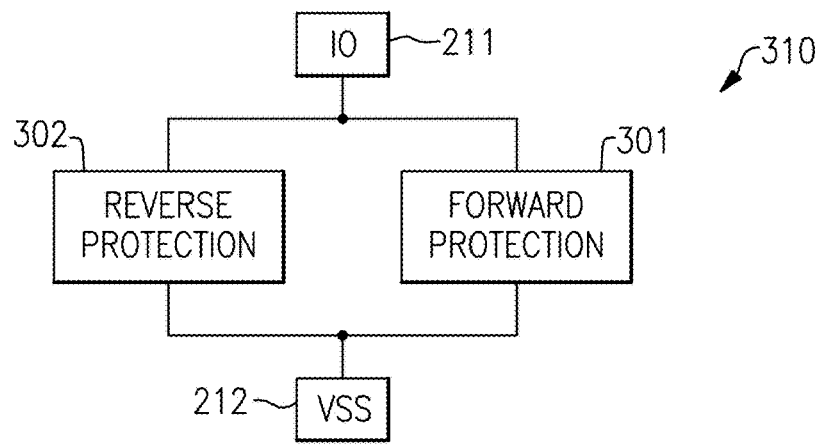
FIG. 8A is a schematic diagram of a bidirectional protection structure according to one embodiment.

FIG. 8A is a schematic diagram of a bidirectional protection structure 310 according to one embodiment. The bidirectional protection structure 310 includes a forward protection SCR 301 and a reverse protection structure 302. The forward protection SCR 301 includes an anode connected to the signal terminal 211 and a cathode connected to the ground terminal 212. The forward protection SCR 301 can be implemented in accordance with any of the embodiments herein, including, for example, any of the SCR configurations described above with respect to FIGS. 3A to 7.

As shown in FIG. 8A, the reverse protection structure 302 includes an anode electrically connected to the ground terminal 212 and a cathode connected to the signal terminal 211. The reverse protection structure 302 has been included to operate in combination with the forward protection SCR 301 to provide bidirectional protection against overvoltage.

For example, the forward protection SCR 301 activates to provide protection against positive polarity electrical overstress that causes the voltage of the signal terminal 212 to increase relative to the voltage of the ground terminal 212. The forward protection SCR 301 has a forward trigger voltage and a forward holding voltage that controls a forward protection characteristic of the bidirectional protection structure 310.

With continuing reference to FIG. 8A, the reverse protection structure 302 activates to provide protection against negative polarity electrical overstress that causes the voltage of the signal terminal 211 to decrease relative to the voltage of the ground terminal 212. Thus, the reverse protection structure 302 has a reverse trigger voltage and a reverse holding voltage that controls a reverse protection characteristic of the bidirectional protection structure 310.

In certain implementations herein, the forward protection SCR 301 and the reverse protection structure 302 are implemented in a common layout with a DNW to enhance integration.

Figure 8B:
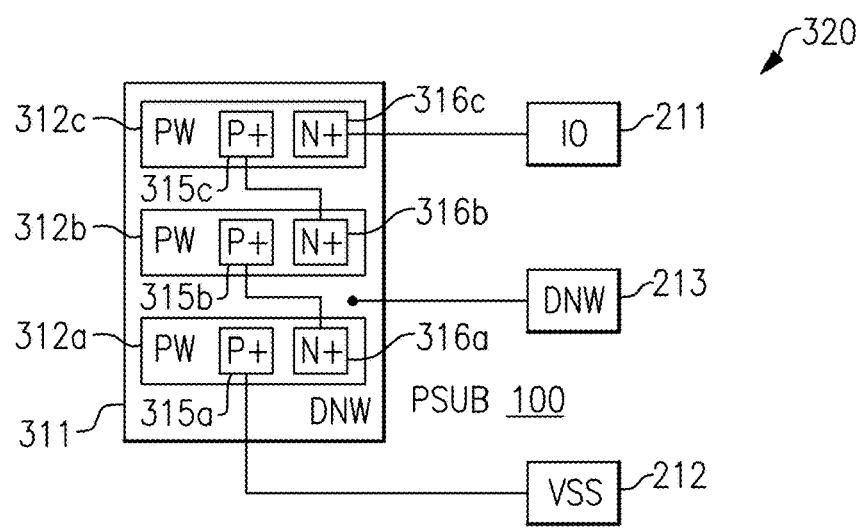
FIG. 8B is a plan view of a reverse protection structure according to one embodiment.
Figure 8C:
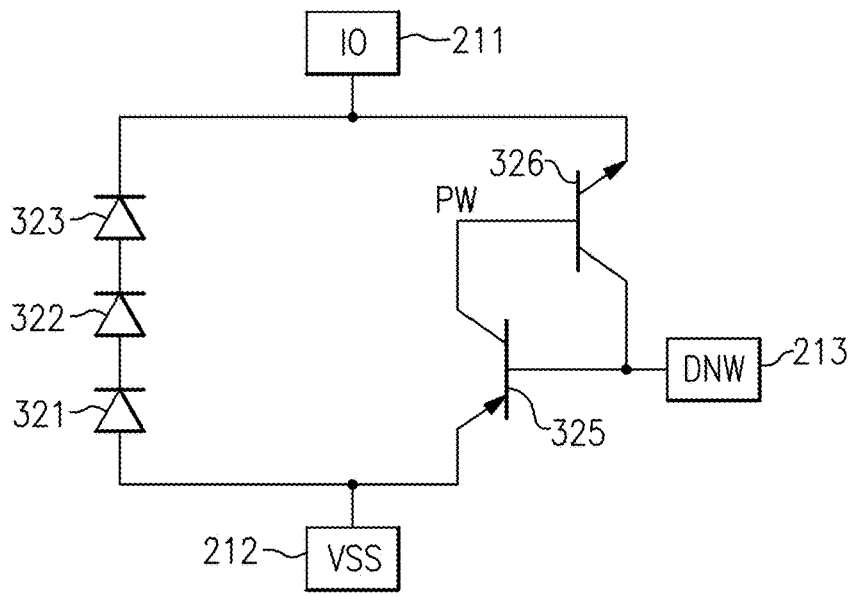
FIG. 8C is a circuit diagram of the reverse protection structure of FIG. 8B.

FIG. 8B is a plan view of a reverse protection structure 320 according to one embodiment. FIG. 8C is a circuit diagram of the reverse protection structure 329 of FIG. 8B. The reverse protection structure 320 depicts one embodiment of a reverse protection structure that can operate in combination with a forward protection SCR to provide bidirectional protection. However, forward protection SCRs can operate in combination with other types of reverse protection structures.

With reference to FIGS. 8B and 8C, the reverse protection structure 320 is formed in a DNW 311 that is formed in the PSUB 100. In certain implementations, a forward protection SCR is also formed in the DNW 311 to enhance overall integration.

As shown in FIG. 8B, a first PW 312a, a second PW 312b, and a third PW 312c are formed in the DNW 311. Additionally, a first P+ region 315a and a first N+ region 316a are formed in the first PW 312a. Furthermore, a second P+ region 315b and a second N+ region 316b are formed in the second PW 312b. Additionally, a third P+ region 315c and a third N+ region 316c are formed in the third PW 312c.

Various connections in metallization are shown, including connections between the second P+ region 315b and the first N+ region 316a and between the third P+ region 315c and the second N+ region 316b. Connections to the signal terminal 211, the ground terminal 212, and the DNW terminal 213 are also shown.

The circuit diagram of FIG. 8C depicts various circuit components arising from the structure of FIG. 8B. As shown in FIG. 8C, a first diode 321, a second diode 322, a third diode 323, a PNP bipolar transistor 325, and an NPN bipolar transistor 326 are present.

With continuing reference to FIGS. 8B and 8C, the first diode 321, the second diode 322, and the third diode 323 are connected in series (from anode to cathode) between the ground terminal 212 and the signal terminal 211. The first diode 321 has an anode and a cathode associated with the first P+ region 315a and the first N+ region 316a, respectively. Additionally, the second diode 322 has an anode and a cathode associated with the second P+ region 315b and the second N+ region 316b, respectively. Furthermore, the third diode 323 has an anode and a cathode associated with the third P+ region 315c and the third N+ region 316c, respectively.

The PNP bipolar transistor 325 and the NPN bipolar transistor 326 are cross-coupled to form a reverse protection SCR that operates in parallel with the series combination of diodes 321-323 to provide reverse protection. The PNP bipolar transistor 325 includes an emitter associated with the first P+ region 315a, a base associated with the DNW 311, and a collector associated with the third PW 312c. Additionally, the NPN bipolar transistor 326 includes an emitter associated with the third N+ region 316c, a base associated with the third PW 312c, and a collector associated with the DNW 311.

When activated in response to negative polarity electrical overstress, the combination of the series diodes 321-323 and reverse protection SCR 325/326 operate to provide electrical overstress protection. The presence of two parallel protection paths provides lower on-state resistance and more robust protection relative to a configuration with a single path.

Although one embodiment of reverse protection is depicted in FIGS. 8B and 8C, other implementations of reverse protection structures are possible.

Applications

Devices employing the above described schemes can be implemented into various electronic devices. Examples of the electronic devices can include, but are not limited to, consumer electronic products, parts of the consumer electronic products, electronic test equipment, communication infrastructure applications, etc. Further, the electronic device can include unfinished products, including those for communication, industrial, medical and automotive applications.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. A silicon controlled rectifier (SCR) protection structure for protecting an interface from an electrical overstress event, the SCR protection structure comprising:
   an n-type well (NW) formed in a substrate;
   a p-type well (PW) formed in the substrate adjacent to the NW;
   a plurality of active regions including a first p-type active (P+) fin region over the NW and connected to an anode terminal, and a first n-type active (N+) fin region over the PW and connected to a cathode terminal; and
   a plurality of polysilicon gate regions formed over the PW and NW, wherein the plurality of polysilicon gate regions separate the plurality of active regions.

2. The SCR protection structure of claim 1, wherein the plurality of polysilicon gate regions include a first polysilicon gate region over the NW and a second polysilicon gate region over the PW.

3. The SCR protection structure of claim 2, wherein the plurality of active regions further include a second N+ active fin region between the first polysilicon gate region and the second polysilicon gate region, wherein the second N+ active fin region crosses a boundary between the NW and the PW.

4. The SCR protection structure of claim 3, further comprising a metal conductor extending over a portion of the second polysilicon gate region.

5. The SCR protection structure of claim 3, further comprising a metal conductor extending along the boundary between the NW and the PW and over the second N+ active fin region.

6. The SCR protection structure of claim 1, further comprising a deep n-type well (DNW) isolating the NW and the PW from the substrate, and a DNW bias circuit connected between a power supply voltage and the DNW.

7. The SCR protection structure of claim 1, further comprising a poly bias circuit configured to bias the plurality of polysilicon gate regions.

8. The SCR protection structure of claim 1, further comprising a trigger circuit electrically connected between the anode terminal and the PW or between the cathode terminal and the NW.

9. The SCR protection structure of claim 8, wherein the trigger circuit includes a resistor-capacitor (RC) network.

10. The SCR protection structure of claim 8, wherein the trigger circuit includes at least one diode.

11. The SCR protection structure of claim 1, wherein the NW is electrically floating.

12. The SCR protection structure of claim 1, wherein the plurality of active regions are not separated by any shallow trench isolation (STI) regions.

13. The SCR protection structure of claim 1, fabricated in a fin field-effect transistor (FinFET) process.

14. A semiconductor die comprising:
   a plurality of pads including a signal pad and a ground pad;
   a circuit electrically connected to the signal pad; and
   a silicon controlled rectifier (SCR) including an anode terminal electrical connected to the signal pad and a cathode terminal electrically connected to the ground pad, wherein the SCR comprises:
      an n-type well (NW) formed in a substrate;
      a p-type well (PW) formed in the substrate adjacent to the NW;
      a plurality of active regions including a first p-type active (P+) fin region over the NW and connected to the anode terminal, and a first n-type active (N+) fin region over the PW and connected to the cathode terminal; and
      a plurality of polysilicon gate regions formed over the PW and NW, wherein the plurality of polysilicon gate regions separate the plurality of active regions.

15. The semiconductor die of claim 14, wherein the SCR further comprises a trigger circuit electrically connected between the anode terminal and the PW or between the cathode terminal and the NW.

16. The semiconductor die of claim 14, further comprising a deep n-type well (DNW) isolating the NW and the PW from the substrate, wherein the SCR further comprises a DNW bias circuit connected between a power supply voltage and the DNW.

17. The semiconductor die of claim 14, further comprising a power supply clamp connected between a power supply voltage pad and the ground pad, wherein the SCR further comprises a trigger circuit connected between the NW and the power supply voltage pad.

18. The semiconductor die of claim 14, wherein the circuit comprises a radio frequency (RF) circuit and the signal pad comprises an RF signal pad.

19. The semiconductor die of claim 14, fabricated in a fin field-effect transistor (FinFET) process.

20. A method of forming a silicon controlled rectifier (SCR) protection structure, the method comprising:
   forming an n-type well (NW) in a substrate;
   forming a p-type well (PW) formed in the substrate adjacent to the NW;
   forming a plurality of active regions over the PW and the NW, wherein the plurality of active regions include a first p-type active (P+) fin region over the NW and serving as an anode of the SCR, and a first n-type active (N+) fin region over the PW and serving as a cathode of the SCR; and
   separating the plurality of active regions by forming a plurality of polysilicon gate regions over the PW and NW.

\* \* \* \* \*